United States Patent [19]
Kothandaraman et al.

[11] Patent Number: 6,064,231
[45] Date of Patent: May 16, 2000

[54] CMOS INPUT BUFFER PROTECTION CIRCUIT

[75] Inventors: Makeshwar Kothandaraman; Bernard Lee Morris, both of Emmaus; Bijit Thakorbhai Patel, Breinigsville; Wayne E. Werner, Coopersburg, all of Pa.

[73] Assignee: Lucent Technologies, Inc., Murray Hill, N.J.

[21] Appl. No.: 09/069,062

[22] Filed: Apr. 28, 1998

[51] Int. Cl.[7] .................. H03K 19/0175; H03K 19/094; H03K 19/003

[52] U.S. Cl. .............................. 326/83; 326/80; 326/81; 326/86; 326/30; 326/21; 326/34

[58] Field of Search .................................. 326/80, 81, 83, 326/86, 20, 21, 34

[56] References Cited

U.S. PATENT DOCUMENTS

| | | | |
|---|---|---|---|
| 5,764,077 | 6/1998 | Andresen et al. | 326/34 |
| 5,828,231 | 10/1998 | Bazargan | 326/81 |
| 5,892,377 | 4/1999 | Johnston et al. | 327/108 |
| 5,923,184 | 7/1999 | Ooms et al. | 326/50 |

*Primary Examiner*—Michael Tokar
*Assistant Examiner*—James A. Cho

[57] ABSTRACT

A low voltage CMOS input buffer protection circuit that is used to protect an input buffer from any high voltage signal (e.g., 5 V) that may appear along a signal bus. The protection circuit is also "hot-pluggable", meaning that the protection circuit will not draw any current when not powered (i.e., when VDD is not present). The circuit includes a CMOS transmission gate and utilizes on-chip generated reference voltages to provide the necessary protection.

4 Claims, 3 Drawing Sheets

CMOS INPUT BUFFER PROTECTION CIRCUIT

BACKGROUND OF THE INVENTION

1. Technical Field

The present invention relates to a CMOS input buffer protection circuit and, more particularly, to a CMOS input buffer protection circuit formed in low voltage CMOS technology (i.e. 3.3 V) that is tolerant to high input voltages (i.e. 5 V).

2. Description of the Prior Art

In many areas of CMOS circuit design there are arrangements that include sections that run between 0–5 V and other sections that use a voltage supply range of only 0–3.3 V. There is often a need to provide a "buffer" circuit between these sections. Thus, there is a need to supply a circuit in standard low voltage CMOS technology (e.g., 3.3 V) that can tolerate a relative high voltage (i.e., 5 V) on its input. Additionally, many system configurations require a circuit that is "hot pluggable", meaning that the circuit will not draw any current from a bus that is at a high voltage, even when the circuit is not powered (i.e., when VDD is not present). Further, the circuit should be designed so that it is not "harmed" when exposed to relatively high voltages. In particular, if the gate oxide of a MOS transistor is subjected to too high a voltage, it will break down, causing gate-to-drain and/or gate-to-source shorts. Likewise, the drain-to-source junction of a MOS transistor will be degraded by hot carriers if it is subjected to too great a voltage. Thus, a MOS circuit that is subjected to voltages higher than the technology is designed to work at must be designed in such a way that the individual transistors in the circuit never see these higher voltages across their gate oxides or their source-to-drain junctions.

One problem with a low voltage technology CMOS buffer interfacing with a relatively high voltage is that the source of a P-channel output transistor is usually connected to the low voltage power supply VDD. If a voltage greater than VDD is applied to the drain of this device (where the drain is usually connected to the PAD of the buffer), it will forward bias the parasitic diode inherent in the P-channel device, since the N-tub backgate of the P-channel transistors is usually connected to VDD.

The prior art circuit of FIG. 1 solves this problem by generating a supply voltage VFLT that is equal to VDD when the PAD voltage is less than VDD, and that is equal to the PAD voltage when PAD is greater than VDD. This reference voltage VFLT is then applied to the N-tub backgate of all P-channel transistors whose source or drain is connected to PAD voltage. The use of VFLT prevents the parasitic diodes of these transistors from ever being forward biased. Referring to FIG. 1, voltage generator circuit 10 is configured to generate a supply voltage VFLT that may be applied to the N-tub backgate of a pair of P-channel transistors 11 and 12. As configured, circuit 10 is used for situations where the PAD voltage (signal bus) appearing at node A may be (at times) greater than the supply voltage VDD. In particular, when PAD goes higher than VDD by a single P-channel threshold voltage, denoted Vtp, transistor 11 turns "on" and transistor 10 turns "off". The output voltage, VFLT, is then equal to the PAD voltage. Therefore, the backgate voltage will be brought up to the high level of PAD and prevent the turn "on" of its associated parasitic diode. During normal operating conditions when PAD<VDD, transistor 11 will be "on" and transistor 12 will be "off", allowing output voltage VFLT to be equal to VDD.

While this design affords some protection for high voltages appearing at the PAD terminal, it is not "hot pluggable". That is, if VDD is not present, circuit 10 as depicted in FIG. 1 will have the full PAD voltage across the gate oxide of transistor 11. If this PAD is a relatively high voltage, then the reliability of the circuit is at risk.

One known solution to the above criteria is to utilize a relatively thick gate oxide for any devices that may be exposed to the relatively high voltages at their gate terminals and utilize a standard gate oxide for all remaining devices. This is a very expensive technique that adds appreciable extra cost and process time to conventional CMOS processing technology.

SUMMARY OF THE INVENTION

The present invention relates to a CMOS input buffer protection circuit and, more particularly, to a CMOS input buffer protection circuit formed in low voltage CMOS technology (i.e. 3.3 V) that is tolerant to high input voltages (i.e. 5 V) and will not draw any current in the "no power" state (i.e., when VDD is not present).

In accordance with the present invention, a reference voltage generator is used to provide a pair of reference voltage inputs, VDD2 and VD2P, to a CMOS input buffer protection circuit, where both the power supply VDD and signal bus voltage (hereinafter referred to as "PAD") are also present as inputs. The reference voltage generator is configured to provide an output VDD2 equal to VDD as long as VDD is present, and when VDD is not present—meaning either that VDD=0, or any other condition where the VDD voltage does not register, such as a broken lead or disconnection (all of these situations hereinafter referred to as a "hot pluggable" condition), VDD2 is held at a predetermined voltage below the PAD voltage (a typical example is holding VDD2 a value of two diode drops below PAD). Reference voltage VD2P is generated from VDD2 and is equal to one P-channel threshold voltage (Vtp) less than VDD2. In the CMOS input buffer of the present invention, a pair of N-channel devices are connected in series with their gate terminals held at VDD and VDD2, respectively. As long as the power supply is present, both of these transistors will be in the "on" state. A first P-channel device and a resistor are connected in series and coupled to the input signal (PAD) line, where the gate of the first P-channel device is held at the generated voltage VD2P. The two sets of series-connected devices are coupled together by connecting the drain of the first N-channel device to the drain of the first P-channel device (node A). A transmission gate is formed by a third P-channel device and a second N-channel device, with the gate of the N-channel device held at VDD2 and the gate of the P-channel device is coupled to node A. The input voltage to the transmission gate is the voltage appearing at the source of the first P-channel device and the output voltage of the transmission gate is defined as the output of the protection circuit and is applied as the input to a conventional CMOS input buffer.

As long as VDD is present and the PAD voltage is less than VDD, the PAD voltage will pass through the transmission gate and form the output of the buffer circuit. Once the PAD voltage is greater than VDD, the voltage VDD will pass through to the output. When VDD is not present (i.e., a "hot-pluggable" condition), the transmission gate will turn "off" and thus prevent any voltage from passing through to the input buffer (the input buffer will therefore not draw any current). The input voltage to the transmission gate will thus be protected from seeing the full PAD voltage potential.

Additionally, the backgate of each P-channel device is held at a VFLT voltage generated by VDD2 to prevent the P-channel devices from being forward-biased in the absence of VDD.

BRIEF DESCRIPTION OF THE DRAWINGS

Referring now to the drawings, where like numerals represent like parts in several views.

DETAILED DESCRIPTION

Figure 2:
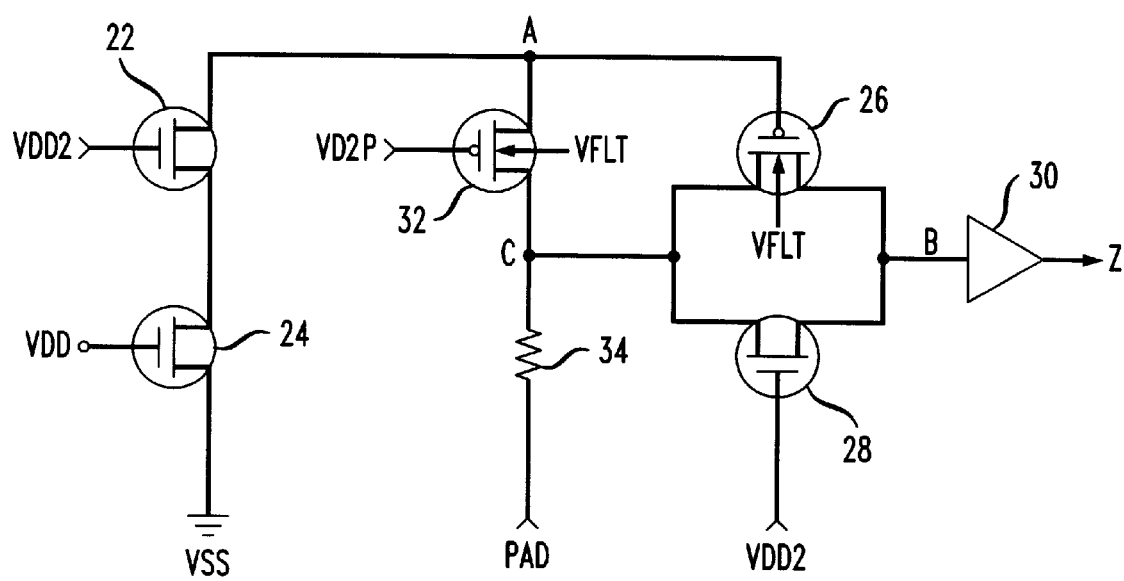
FIG. 2 illustrates an exemplary input buffer formed in accordance with the present invention.

An exemplary CMOS input buffer protection circuit 20 is illustrated in FIG. 2.

As discussed above, the circuit arrangement of the present invention is "hot-pluggable", meaning that the protection circuit will not draw any current from a bus (such as PAD) that is at a high voltage, even when the circuit is not powered (i.e., when VDD is not present). In general, the circuit is configured to provide for "normal" operation when VDD is present and the PAD voltage is less than VDD, and to provide for "protection" operation when either VDD is not present or the PAD voltage exceeds a pre-defined high voltage value (when configuring the circuit of the present invention for 3.3 V technology CMOS, a PAD voltage of about 5 V is considered a "high voltage" condition).

Figure 4:
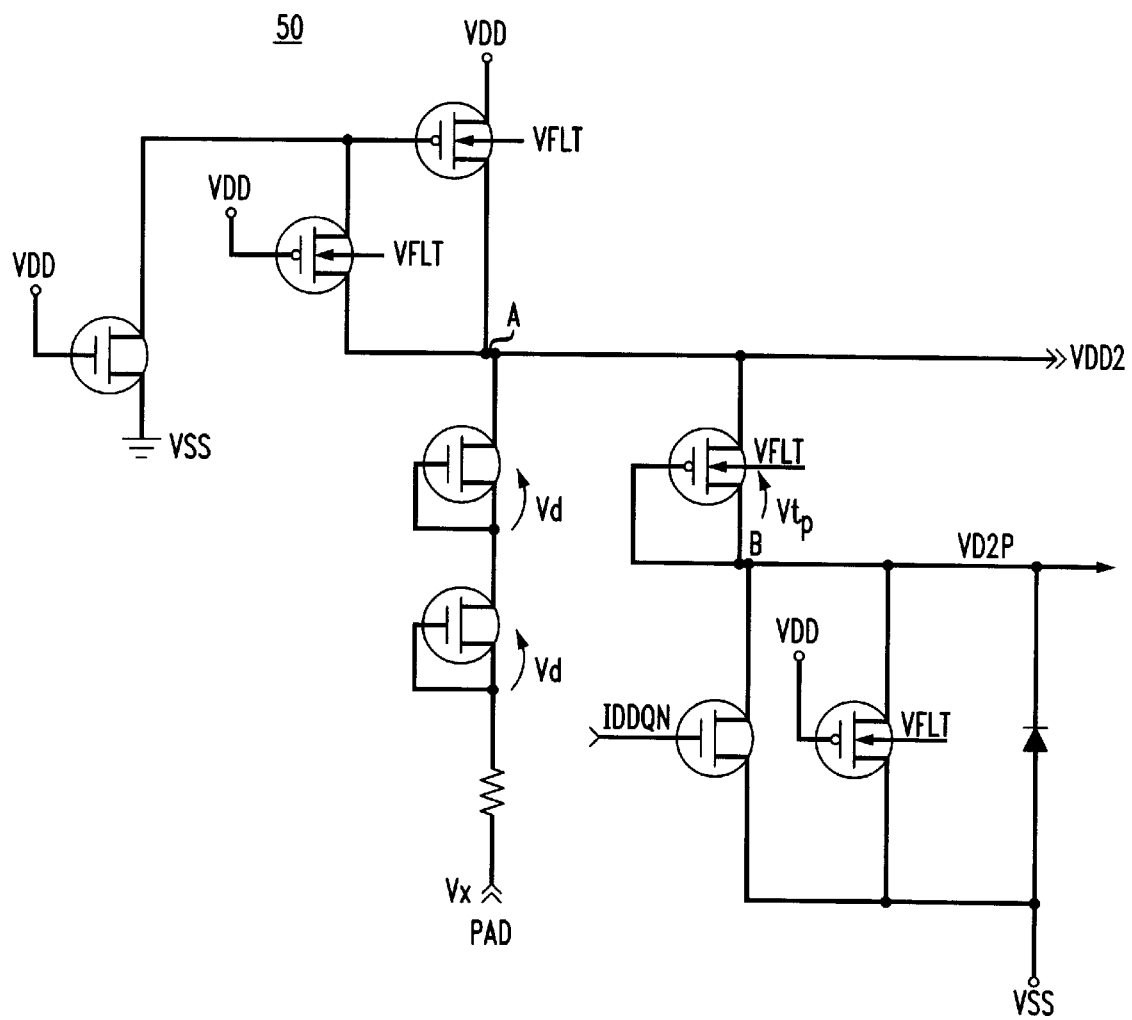
FIG. 4 contains a schematic diagram of an exemplary CMOS reference voltage generator useful with the input buffer of the present invention.

Input buffer protection circuit 20 utilizes a pair of generated reference voltages VDD2 and VD2P to ensure the proper operation of the circuit. FIG. 4 illustrates an exemplary CMOS reference voltage generator useful in providing voltages VDD2 and VD2P from reference voltages VDD and VSS. CMOS reference generator 50 of FIG. 4 is configured such that generated reference voltage VDD2 is essentially equal to VDD as along as VDD is "present" (typically 3.0–3.6 volts, but in general any voltage above approximately 1 V), regardless of the voltage on the signal bus ("PAD"), which may rise to, for example, 5 V if a mix of CMOS technology is present in the circuit. If VDD is not present—meaning either that VDD=0, or any other condition where the VDD voltage does not register, such as a broken lead or disconnection (all of these situations hereinafter referred to as "hot-pluggable" condition), the circuit is configured to maintain VDD2 at a level of at least two diode drops below the voltage appearing at PAD. Therefore, even in the situation where PAD=5.5 V, VDD2 will be approximately 2.8 V and will therefore protect any and all following circuit elements from the PAD high voltage. In general, as long as VDD is present, VDD2=VDD and VD2P will be one P-channel threshold voltage (Vtp) less than VDD2. When VDD is not present, VDD2 will be held at a predetermined voltage less than the voltage appearing at the PAD input. As mentioned above, in a preferred embodiment, VDD2 will be held approximately two diode voltage drops (2 Vd) below the PAD voltage.

Referring to input buffer protection circuit 20 of FIG. 2, a first N-channel device 22 has its gate held at the generated voltage potential VDD2 and a second N-channel device 24 has its gate held at the reference voltage VDD, where the source of device 22 is coupled to the drain of device 24 and the source of device 24 is coupled to ground, denoted VSS. The drain of first device 22 is defined as a first circuit node, labeled A in FIG. 2. A transmission gate is formed of a first P-channel device 26 and a third N-channel device 28, where the gate of P-channel device 26 is coupled to node A and the gate of N-channel device 28 is held at the generated voltage potential VDD2. The output from the transmission gate, denoted as node B in circuit 20, is the actual input to a conventional input buffer 30. Input buffer 30 may comprise any well-known CMOS buffer design. A second P-channel device 32 has its gate biased at the second generated reference voltage VD2P (which is one P-channel threshold voltage less than VDD2) and its drain coupled to node A. The source of device 32 is used as the input to the transmission gate and is defined as node C of circuit 20. A resistor 34 is coupled between the signal bus (labeled as "PAD" in FIG. 2) and node C.

In operation, as long as VDD is present and the voltage appearing at the "PAD" bus is less than VDD, input buffer protection circuit will operate in its "normal" state, allowing the full PAD voltage to appear at node B. In particular, when VDD is present, VDD2=VDD (as discussed above and shown in FIG. 4) and both N-channel transistors 22 and 24 will be "on". When these transistors are "on", node A will be pulled low to the VSS value and this low voltage turns "on" P-channel device 26. The appearance of voltage VDD2 (=VDD) at the gate of transistor 28 will also turn "on" N-channel transistor 28. Therefore, the transmission gate formed by transistors 26 and 28 will be "on", allowing the voltage appearing at its input (node C) to be transferred to the output (node B). As long as the voltage at PAD is less than reference voltage VDD, the reference voltage VD2P will maintain P-channel device 32 "off", allowing the voltage at node C (and then, in turn, node B) to be approximately equal to the PAD voltage.

If the PAD voltage becomes greater than VDD (for example, when forming circuit 20 in a low voltage (3.3 V) CMOS technology and there is a high voltage (5 V) signal present along the bus (PAD)), device 32 will turn "on". Device 32 is sized such that when it is "on", it has a much smaller resistance than devices 22 and 24, so that when device 32 is "on", node A will be essentially equal to node C. This will shut "off" device 26, ensuring that node B cannot exceed the voltage VDD.

For the case where VDD is not present, input buffer protection circuit 20 protects input buffer 30 from drawing any current. First, as will be discussed below, when VDD is not present, generated reference voltage VDD2 will be maintained at a reference voltage a predetermined level below the voltage appearing at the PAD terminal. Additionally, the reference voltage VD2P will be maintained at a value slightly less than VDD2. Further, when VDD is not present, transistor 32 will turn "on", pulling node A high and turning "off" P-channel device 26 of the transmission gate. Assuming, worst case, that the PAD voltage is the 5 V high voltage value, VDD2 will be approximately 3 V and VD2P will be approximately 2 V. The voltage appearing at node B will be, at most, 3 V. Since device 26 has been turned "off", input buffer protection circuit 20 prevents any high voltage from appearing at the input to buffer 30.

Figure 1:
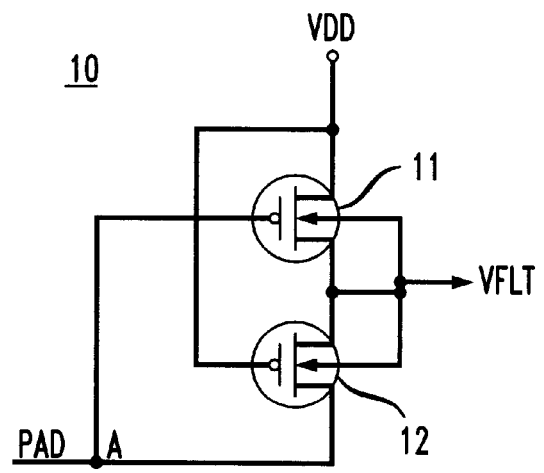
FIG. 1 illustrates a prior art voltage generator circuit as discussed above.
Figure 3:
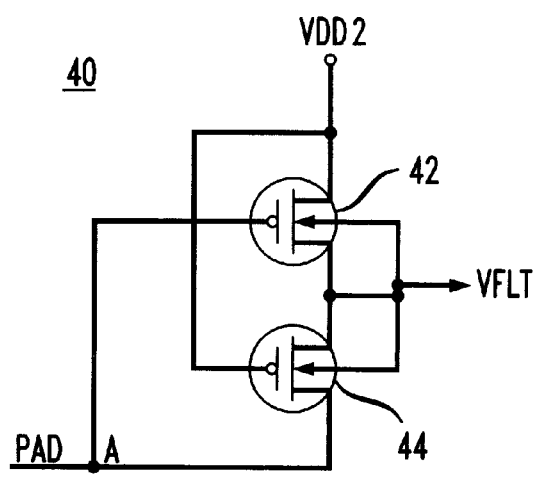
FIG. 3 illustrates an exemplary reference voltage generator used to form the VFLT backgate voltage utilized in the input buffer of the present invention.

Additional protection is provided for P-channel devices 26 and 32 by applying a generated N-tub backgate voltage VFLT to the substrate of each device. FIG. 3 illustrates an exemplary circuit capable of generating the voltage VFLT. In general, the circuit is similar to the prior art circuit of FIG.

1, except that VDD2 is coupled to the source of transistor 11. Therefore, when VDD is not present, VDD2 will track the PAD voltage and prevent the parasitic diodes within the P-channel devices from being forward biased.

As seen from the above discussion, none of the devices in circuit 20 have a gate or source-to-drain voltage greater than the normal VDD (3.6 V maximum value) in the case where either VDD is not present, or VDD is present. Therefore, the input buffer circuit of the present invention allows a standard digital CMOS input buffer 30 made in a low voltage technology to interface with high voltage signals (PAD) in both normal (VDD present) and "hot-plug" (VDD not present) conditions.

What is claimed is:

1. An integrated circuit including a CMOS input buffer protection circuit comprising
   a transmission gate including a first P-channel device and a first N-channel device, drains of the devices coupled together to form an input of the transmission gate and sources of the devices coupled together to form an output of the transmission gate, the first N-channel device having its gate held at a first generated reference voltage (VDD2);
   a second N-channel device having its gate held at a circuit reference voltage (VDD) and its source coupled to a ground plane (VSS);
   a third N-channel device having its gate held at the first generated reference voltage (VDD2), its source coupled to drains of the second N-channel device and its drain coupled to a gate of the first P-channel device of the transmission gate;
   a second P-channel device having its gate held at a second generated reference voltage (VD2P) less than the first generated reference voltage and having its drain coupled to the input of the transmission gate; and
   a resistor coupled between the transmission gate input and a bus reference voltage (PAD), wherein as long as VDD is present and PAD<VDD, VDD2=VDD and the transmission gate will be "on".

2. The integrated circuit including an input buffer as defined in claim 1 wherein a predetermined voltage 2 Vd is equal to a voltage across a pair of diode-connected N-channel devices.

3. The integrated circuit including an input buffer as defined in claim 1 wherein the input buffer further comprises a backgate protection circuit for providing a bias voltage VFLT to the N-tub backgate of the P-channel devices forming said input buffer, wherein VFLT=VDD2.

4. An integrated circuit including a CMOS input buffer comprising:
   a CMOS input buffer circuit;
   a transmission gate including a first P-channel device and a first N-channel device, drains of the devices coupled together to form an input of the transmission gate and sources of the devices coupled together to form an output of the transmission gate, the first N-channel device having its gate held at a first generated reference voltage (VDD2) and the output of the transmission gate coupled to an input of the CMOS input buffer circuit;
   a second N-channel device having its gate held at a circuit reference voltage (VDD) and its source coupled to a ground plane (VSS);
   a third N-channel device having its gate held at the first generated reference voltage (VDD2), its source coupled to a drain of the second N-channel device and its drain coupled to the gate of the first P-channel device of the transmission gate;
   a second P-channel device having its gate held at a second generated reference voltage (VD2P) less than the first generated reference voltage and having its drain coupled to the input of the transmission gate; and
   a resistor coupled between the transmission gate input and a bus reference voltage (PAD), wherein as long as VDD is present and PAD<VDD, VDD2=VDD and the transmission gate will be "on".

* * * * *